United States Patent [19]

Seo

[11] 4,128,489
[45] Dec. 5, 1978

[54] PIEZO-ELECTRIC MATERIAL

[75] Inventor: Iwao Seo, Inashiki, Japan

[73] Assignee: Mitsubishi Petrochemical Company Limited, Marunouchi, Chiyoda, Japan

[21] Appl. No.: 752,536

[22] Filed: Dec. 20, 1976

[30] Foreign Application Priority Data

Dec. 29, 1975 [JP] Japan .................. 50-159185

[51] Int. Cl.² .............. C04B 35/00; H01L 41/18
[52] U.S. Cl. ................... 252/62.9; 260/823; 260/887; 260/897 C
[58] Field of Search .............. 252/62.9, 64, 65; 260/823, 887, 897 C

[56] References Cited

U.S. PATENT DOCUMENTS

| | | | |
|---|---|---|---|
| 1,886,235 | 11/1932 | Meissner | 252/62.9 |
| 2,989,481 | 6/1961 | Miller | 252/62.9 |
| 3,213,027 | 10/1965 | Fatuzzo et al. | 252/62.9 X |
| 3,571,491 | 3/1971 | Markowski | 252/64 X |
| 3,801,839 | 4/1974 | Yo | 252/62.9 X |
| 3,832,580 | 8/1974 | Yamamuro et al. | 252/62.9 X |

FOREIGN PATENT DOCUMENTS 2315767  10/1974  Fed. Rep. of Germany .......... 252/62.9

*Primary Examiner*—Jack Cooper
*Attorney, Agent, or Firm*—Donald D. Mon

[57] ABSTRACT

Piezo-electric material comprising composite of acetal resin which is blended with polymer having high relative permittivity and piezo-electric ceramics powder, the composite being molded and electeretized. The piezo-electric material has excellent moldability and pliability.

9 Claims, No Drawings

PIEZO-ELECTRIC MATERIAL

BACKGROUND OF THE INVENTION

This invention relates to piezo-electric material, more particularly to piezo-electric material with a high piezo-electric modulus, and having excellent flexibility and moldability.

Heretofore, it is well known that crystals which do not have a center of symmetry show piezo-electricity and inorganic materials such as rock crystal, Rochell salt, and lead zirconate-lead titanate ceramics are usually utilized as piezo-electric material. These materials have high piezo-electric modulus, but they are difficult to be formed. Therefore it is difficult to obtain thin piezo-electric material with pliability. On the other hand, it is recognized that some high polymer materials such as natural high polymer as cellulose and protein, and stretched film of poly-γ-methyl-L-glutamate synthetic high polymer, and the like, show piezo-electricity. Besides it is known that some electrets of synthetic high polymers, for example, electrets obtained by a manufacturing method which comprises stretching films such as polyvinyl fluoride, polyvinylidene fluoride, polyvinyl chloride, polyacrylonitrile polycarbonate, and the like by several times at a temperature approaching the softening temperature, heating from a room temperature under a condition of applied electric field, and cooling, show piezo-electricity. Organic piezo-electric materials obtained in the way described above have good flexibility and pliability, but they have anisotropy of piezo-electric moduli because stretching treatment is done, and there are many electrets whose piezo-electric moduli are not very high and variable according to temperature or humidity. For example, even a piezo-electric modulus in stretching direction ($d_{31}$) of electretized polyvinylidene fluoride which has the highest piezo-electric modulus is only $4.0 \times 10^{-7}$ (CGS esu). Further, as they are stretched, it is very difficult to make molded goods with complicated form.

BRIEF SUMMARY OF INVENTION

Accordingly, it is an object of the present invention to provide piezo-electric material in which both defects of conventional inorganic piezo-electric material and defects of conventional organic piezo-electric material are obviated, and which has excellent pliability and moldability, and which has high piezo-electric modulus and which does not have anisotropy of piezo-electric modulus.

Piezo-electric material according to the present invention comprises composite of blend polymer resin and piezo-electric ceramics powder, the blend polymer resin consisting of 99 to 20 percent by weight acetal resin and 1 to 80 percent by weight polar polymer in which relative permittivity is above 4.0 and modulus of elasticity is under $8.0 \times 10^9$ dyne/cm$^2$, the blend polymer resin being added to the piezo-electric ceramics so that amount of the blend polymer being 10 to 90 percent by volume, the composite being molded and electretized.

Piezo-electric material according to the present invention has excellent flexibility, pliability, and moldability, and which has high piezo-electric modulus and which does not have anisotropy of piezo-electric modulus.

Piezo-electric material according to the present invention can be widely applied for industrial uses, for instance, electroacoustic transducer as microphone, head phone, or the like, electromechanical transducer, pressure sensitive element, and living body transducer.

DETAILED DESCRIPTION

In the case of the present invention, acetal resin is oxymethylene homopolymer and copolymer which is mainly composed of oxymethylene group and a small quantity copolymerizable group, for instance, oxyalkylene group as oxyethylene, and in which stabilizing treatment for preventing chain polymer from disintegrating from terminal group is done by blocking the terminal group and in which necessary additives such as thermal stabilizer, light stabilizer, antioxidant, and the others, are contained.

As monomer which is copolymerized with oxymethylene, formaldehyde, dioxane, trioxane, tetraoxane, alkyleneoxide, aliphatic aldehyde, and the like are given.

Melt index of the above acetal resin is preferably about 1.0 to 27.0 (ASTMD-1238/70).

Then, polar polymer blended with acetal resin is polymer with polarity in which relative permittivity is above 4.0 and modulus of elasticity is under $8.0 \times 10^9$ dyne/cm$^2$. As the polar polymer, polymer which can be obtained by polymerizing monomer with polar group such as cyano group (—CN),

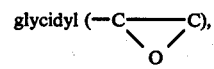

isocyanate group (—NCO) and the like, or polymer in which halogen as fluorine (F), chlorine (Cl), and the like is contained, concretely, urethane rubber, acrylonitrile-butadiene rubber (NBR), polyester ether rubber, chlorosulphonated polyethylene, fluoroelastomer, epichlorohydrin rubber, chloroprene rubber, chlorinated polyethylene, and the like, can be used. Preferably, nitrile rubber, epichlorohydrin rubber, or chlorinated polyolefin can be used as the polar polymer.

Chlorinated polyolefin is resin which can be obtained by reacting polyolefin powder which chlorine to replace one or more elements or radicals in polyolefin by chlorine, by vapor phase method or by solution method. Chlorinated polyolefin with chlorine content of 10 to 70 percent by weight can be used.

The above relative permittivity is the value which is measured at frequency of 1000 Hz under the condition that temperature is 25° C. and relative humidity is 60 percent. Comparison of the relative permittivity of polymers used in the case of the present invention and that of other polymers are shown in Table 9.

And the above modulus of elasticity, being dynamic tensile modulus of elasticity is the value which is measured at frequency of 110 Hz under the condition that temperature is 25° C. and relative humidity is 60 percent.

When the relative permittivity is low, effective charge trap cannot occur. Hence, piezo-electric ability will lower, and blendability of polar polymer with acetal resin will become worse.

When the above modulus of elasticity is higher or nearly same to that of acetal resin, non uniform strain does not occur effectively. Hence, piezo-electric effect will become poor.

As piezo-electric ceramics, in which ceramic is possible domain switching and selected among ferroelectric substances showing piezo-electric effect, following materials can be used;

| (1) | Single component; | $BaTiO_3$, $PbTiO_3$, $PbNb_2O_6$, $(Na_{\frac{1}{2}}Bi_{\frac{1}{2}})TiO_3$, $LiNbO_3$, $LiTaO_3$ |
|---|---|---|
| (2) | Two component; | $PbTiO_3$—$PbZrO_3$, $PbTiO_3$—$Pb(Zn_{\frac{1}{3}}Nb_{\frac{2}{3}})O_3$, $PbTiO_3$—$Pb(Cd_{\frac{1}{3}}W_{\frac{1}{2}})O_3$, $PbTiO_3$—$Pb(In_{\frac{1}{2}}Nb_{\frac{1}{2}})O_3$, $KNbO_3$—$NaNbO_3$, $Cd_2Nb_2O_7$—$NaNbO_3$, $PbNb_2O_6$—$BaNb_2O_6$ |
| (3) | Three component; | |

$PbTiO_3$—$PbZrO_3$—$Pb(Mg_{\frac{1}{3}}Nb_{\frac{2}{3}})O_3$, —$Pb(Co_{\frac{1}{3}}Nb_{\frac{2}{3}})O_3$,
$PbTiO_3$—$PbZrO_3$—$Pb(Zn_{\frac{1}{3}}Nb_{\frac{2}{3}})O_3$, —$Pb(Cd_{\frac{1}{3}}Nb_{\frac{2}{3}})O_3$,
$PbTiO_3$—$PbZrO_3$—$Pb(Mn_{\frac{1}{3}}Nb_{\frac{2}{3}})O_3$, —$Pb(Ni_{\frac{1}{3}}Nb_{\frac{2}{3}})O_3$,
$PbTiO_3$—$PbZrO_3$—$Pb(Sb_{\frac{1}{3}}Nb_{\frac{2}{3}})O_3$, —$Pb(Y_{\frac{1}{2}}Nb_{\frac{1}{2}})O_3$,
$PbTiO_3$—$PbZrO_3$—$Pb(Mg_{\frac{1}{2}}W_{\frac{1}{2}})O_3$,
$PbTiO_3$—$PbZrO_3$—$Pb(Co_{\frac{1}{2}}W_{\frac{1}{2}})O_3$, —$Pb(Cd_{\frac{1}{2}}W_{\frac{1}{2}})O_3$,
$PbTiO_3$—$PbZrO_3$—$Pb(Mn_{\frac{1}{2}}Te_{\frac{1}{2}})O_3$, —$Pb(Mn_{\frac{1}{3}}Sb_{\frac{2}{3}})O_3$,
$PbTiO_3$—$PbZrO_3$—$Pb(Ni_{\frac{1}{3}}Sb_{\frac{2}{3}})O_3$, —$Pb(Fe_{\frac{1}{2}}Nb_{\frac{1}{2}})O_3$
Others
$PbTiO_3$—$Ba(Zn_{\frac{1}{3}}Nb_{\frac{2}{3}})O_3$—$Pb(Zn_{\frac{1}{3}}Nb_{\frac{2}{3}})O_3$
$KNbO_3$—$NaNbO_3$—$LiNbO_3$
$(Pb_{1-x}La_x)(Zr_yTi_z)_{1-x/4}O_3 \quad (x + y = 1)$ As means for mixing acetal resin and polar polymer and ceramics powder, means which is applied popularly for mixing materials, for example, a kneader, roll, an extruder, all sorts of mixer, ball mill, etc., can be applied optionally. Further, as a method for forming a film, sheet, tube, etc., extrusion molding method, calendar molding method, solvent evaporating molding method, etc., can be applied optionally.

An example of a method of mixing is as follows:

Acetal resin is heated up to 180° to 200° C. with heating roll. When acetal resin is enough melted, as polar polymer of the fixed amount is added little by little to the acetal resin, mixing is done. After enough mixing, as ceramics powder of the fixed amount is added little by little to the resulting blend polymer of acetal resin and polar polymer, then enough mixing is done. Then the resulting composite is molded into a film molded article.

A component ratio of polar polymer to the blend polymer of acetal resin and polar polymer is 1 to 80 percent by weight, preferably 10 to 70 percent by weight. When the amount of polar polymer is above 80 percent by weight, the blend polymer become too softened to hold its form. On the other hand, when the amount of polar polymer is under 1 percent by weight, the effect of improvement of piezo-electric modulus is deficient.

The suitable size of the particles of ceramics powder, for improving both piezo-electricity of ceramics and moldability of the composite, is 0.2 to 44μ, preferably 1 to 5μ.

The ratio of ceramics powder to the total amount is 10 to 90 percent by volume, preferably 20 to 70 percent by volume or 70 to 30 percent by volume further preferably 30 to 60 percent by volume. When the content of ceramics powder is under 10 percent by volume, the effect of adding ceramics powder is not enough. On the other hand, when the content of ceramics powder is above 90 percent by volume, molding is difficult. Further, when the content of ceramics powder is above 60 percent by volume, piezo-electric modulus is high, but the mechanical characteristics such as flexibility, film forming ability, etc., fall.

In present invention, ceramic powder is mixed with matrix resin by predetermined weight ratio, which is turned volume ratio into weight ratio by calculation from specific gravity.

For giving piezo-electricity to the above film molded composite, metal films are coated on both surfaces of the molded composite to form electrodes and is heated up to the fixed temperature. Then as the whole condition maintained, electric field of direct current or electric fields of both direct current and alternate current are applied for the fixed hour. Thereafter, with electric field being removed or with electric field being applied, the molded article is so cooled slowly or rapidly as to be heat-electretized.

The most suitable temperature for heat-electretizing is desirably a temperature approaching the crystal relaxation temperature of acetal resin. In the case of this invention, a temperature of 30° to 100° C. is applied.

Further, an application of an electric field is usually done through electrodes of metal foils, metal plates, electroconductive pastes, or vapor evaporating films of metal, or chemical metal plating films deposited on both surfaces of a molded composite. An applied electric field is usually 100 KV/cm to an electric field intensity in which dielectric breakdown does not arise, preferably DC voltage of about 100 to 600 KV/cm. Further, with the DC voltage, alternating current of electric field voltage of 200 to 1000 V/cm can be used.

A treating time is especially not restricted, but suitably above 30 minutes.

By the way in the case of this invention there is characteristics that a piezo-electric molded goods with the intricate configuration can be made by a usual molding process, because a stretching process does not need which the case of a conventional organic piezo-electric material needs.

To further illustrate this invention, the following examples are given; however these examples are not by way of limitation.

A piezo-electric constants in the following examples are a value of piezo-electric moduli of stretch ($d_{31}$).

EXAMPLE 1

Acetal resin (trade name: Delrin 500, manufactured by du Pont Company, Ltd.) was heated up to a temperature of 190° C., and softened. Then, to this softened acetal resin, chlorinated polyethylene with chlorine content of 30 percent by weight was so added little by little that the component ratio was 60/40 (acetal resin/chlorinated polyethylene) by weight. Thereafter, chlorinated polyethylene and acetal resin were enough mixed under applied stress. Then, to the resulting blend polymer, lead zirconate-lead titanate solid solution $(Pb(Zr_{0.55}Ti_{0.45})O_3 + 1$ wt. % $Nb_2O_5)$ ceramics powder was so added little by little that the component ratio of lead zirconate-lead titanate solid solution ceramics powder to the blend polymer was 50/50 by volume. Then, lead zirconate-lead titanate solid solution ceramics powder and the blend polymer were uniformly mixed. Then, the resulting composite was molded into a film of 50μ thickness with a hot press. For giving piezo-electricity to this molded composite this molded composite was heated up to the fixed temperature, thereafter thereto electric field of direct current applied from thereof both surfaces for an hour as the whole condition maintained. Then the molded composite was so cooled rapidly as to be heat-electretized.

Measurements of piezo-electric constant of the piezo-electric material obtained in the manner described above were taken. The results are shown in Table 1.

Herein, an evaporating films of silver which were formed on both surfaces of the piezo-electric material by a vacuum evaporation method were used as electrodes both for electretization and for measurement of piezo-electric constant.

Table 1

| No. | Field strength (KV/cm) | Polarization temperature (° C) | Piezo-electric constant (CGS esu) |
|---|---|---|---|
| 1 | 50 | 40 | $4.25 \times 10^{-7}$ |
| 2 | 100 | 40 | $6.38 \times 10^{-7}$ |
| 3 | 200 | 20 | $6.86 \times 10^{-7}$ |
| 4 | 200 | 30 | $7.43 \times 10^{-7}$ |
| 5 | 200 | 40 | $7.65 \times 10^{-7}$ |
| 6 | 200 | 50 | $7.17 \times 10^{-7}$ |
| 7 | 200 | 60 | $8.34 \times 10^{-7}$ |
| 8 | 200 | 80 | $7.43 \times 10^{-7}$ |
| 9 | 200 | 100 | $7.05 \times 10^{-7}$ |
| 10 | 200 | 120 | $4.73 \times 10^{-7}$ |
| 11 | 300 | 20 | $7.02 \times 10^{-7}$ |
| 12 | 300 | 40 | $8.34 \times 10^{-7}$ |
| 13 | 300 | 60 | $8.64 \times 10^{-7}$ |
| 14 | 300 | 80 | $7.70 \times 10^{-7}$ |
| 15 | 400 | 40 | $7.88 \times 10^{-7}$ |
| 16 | 500 | 40 | $6.09 \times 10^{-7}$ |
| 17 | 600 | 40 | $5.91 \times 10^{-7}$ |

EXAMPLE 2

The film molded composite obtained in the same manner as Example 1 was heated up to a temperature of 60° C., then thereto electric field of direct current 300 KV/cm applied from thereof both surfaces for the fixed time as the whole condition maintained. Then the film molded composite was cooled rapidly.

Measurement of piezo-electric constant of the piezo-electric material obtained in the manner described above were taken. The results are shown in Table 2.

Table 2

| No. | Polarization time | Piezo-electric constant (CGS esu) |
|---|---|---|
| 1 | 15 (min) | $6.80 \times 10^{-7}$ |
| 2 | 30 (min) | $9.24 \times 10^{-7}$ |
| 3 | 1 (hr) | $8.17 \times 10^{-7}$ |
| 4 | 2 (hr) | $7.38 \times 10^{-7}$ |
| 5 | 3 (hr) | $6.98 \times 10^{-7}$ |
| 6 | 5 (hr) | $5.96 \times 10^{-7}$ |

EXAMPLE 3

In the same manner as Example 1, acetal resin (trade name: Delrin 500, manufactured by du Pont Company, Ltd.) and chlorinated polyethylene resin wich chlorine content of 30 percent by weight were mixed with various component ratios to form various blend polymers. To each of the resulting blend polymers, lead zirconate-lead titanate solid solution ceramics powder was so added that the component ratio of lead zirconate-lead titanate solid solution ceramics powder to the blend polymer was 50/50 by volume. Then, each blend polymer and lead zirconate-lead titanate solid solution ceramics powder were mixed. The resulting composites were molded into films. To each of the resulting film molded composites electric field of direct current of 200 KV/cm was applied for an hour, at a temperature of 40° C. Then these film molded composites were so cooled rapidly while the electric field was applied as to be heat-electretized.

Mesurements of piezo-electric constant of the piezo-electric materials obtained in the manner described above were taken. The results are shown in Table 3.

Table 3

| No. | Acetal resin (% by weight) | Chlorine-containing polyethylene (% by weight) | Piezo-electric constant (CGS esu) |
|---|---|---|---|
| 1 | 100 | 0 | $6.80 \times 10^{-7}$ |
| 2 | 99 | 1 | $6.85 \times 10^{-7}$ |
| 3 | 90 | 10 | $7.52 \times 10^{-7}$ |
| 4 | 70 | 30 | $7.92 \times 10^{-7}$ |
| 5 | 60 | 40 | $8.05 \times 10^{-7}$ |
| 6 | 50 | 50 | $7.85 \times 10^{-7}$ |
| 7 | 40 | 60 | $7.34 \times 10^{-7}$ |
| 8 | 30 | 70 | $6.88 \times 10^{-7}$ |
| 9 | 20 | 80 | $5.33 \times 10^{-7}$ |
| 10 | 0 | 100 | $2.38 \times 10^{-7}$ |

EXAMPLE 4

In the same manner as Example 1, acetal resin (trade name: Delrin 500, manufactured by du Pont Company, Ltd.) and chlorinated polyethylene resin with chlorine content of 30 percent by weight were mixed with component ratio of 60/40 (acetal resin/chlorinated polyethylene) by weight. To the resulting blend polymer, lead zirconate-lead titanate ceramics powder was added with various component ratios. Then the blend polymer and lead zirconate-lead titanate solid solution ceramics powder were mixed. Each of the resulting composites was severally molded into a film. Then, to each film molded composite electric field of direct current of 200 KV/cm was applied for an hour, at a temperature of 40° C. Then each molded composite was so cooled rapidly as to be heat-electretized.

Measurements of piezo-electric constant of the piezo-electric materials obtained in the manner described above were taken. The results are shown in Table 4.

Table 4

| No. | Blend polymer (% by volume) | PZT ceramics (% by volume) | Piezo-electric constant (CGS esu) |
|---|---|---|---|
| 1 | 100 | 0 | $1.00 \times 10^{-8}$ |
| 2 | 90 | 10 | $1.28 \times 10^{-7}$ |
| 3 | 70 | 30 | $6.04 \times 10^{-7}$ |
| 4 | 60 | 40 | $7.65 \times 10^{-7}$ |
| 5 | 50 | 50 | $8.28 \times 10^{-7}$ |
| 6 | 40 | 60 | $9.48 \times 10^{-7}$ |
| 7 | 30 | 70 | $1.28 \times 10^{-6}$ |
| 8 | 10 | 90 | $2.11 \times 10^{-6}$ |

EXAMPLE 5

In the same manner as Example 1, acetal resin (trade name: Delrin 500, manufactured by du Pont Company, Ltd.) and chloroprene rubber (Neoprene W, manufactured by du Pont Company, Ltd.) were mixed with component ratios shown in Table 5. Then with the resulting blend polymers lead zirconate-lead titanate solid solution ceramics powder was so mixed that the component ratio was 50/50 by volume. Then these composites were molded into films. Then to the resulting film molded composites, electric field of direct current 200 KV/cm was applied for an hour. Then these film molded composites were so cooled rapidly while the electric field was applied as to be heat-electretized.

Measurements of piezo-electric constant of the piezo-electric materials obtained in the manner described above were taken. The results are shown in Table 5.

Table 5

| No. | Acetal resin (per cent by weight) | Chloroprene rubber (per cent by weight) | Piezo-electric constant (CGS esu) |
|---|---|---|---|
| 1 | 90 | 10 | $7.14 \times 10^{-7}$ |

Table 5-continued

| No. | Acetal resin (per cent by weight) | Chloroprene rubber (per cent by weight) | Piezo-electric constant (CGS esu) |
|---|---|---|---|
| 2 | 70 | 30 | $7.31 \times 10^{-7}$ |
| 3 | 60 | 40 | $7.52 \times 10^{-7}$ |
| 4 | 50 | 50 | $7.88 \times 10^{-7}$ |
| 5 | 40 | 60 | $8.03 \times 10^{-7}$ |
| 6 | 30 | 70 | $7.91 \times 10^{-7}$ |

EXAMPLE 6

In the same manner as Example 1, acetal resin (trade name: Delrin 500, manufactured by du Pont Company, Ltd.) and chlorinated polypropylene with chlorine content of 35 percent by weight were mixed with component ratios shown in Table 6. Then with the resulting blend polymers lead zirconate-lead titanate solid solution ceramics powder was so mixed that the component ratios was 50/50 by volume. Then the resulting composites were molded into films. Then to these film molded composites electric field of direct current of 200 KV/cm was applied at a temperature of 40° C., for an hour. Then these film molded composites were so cooled rapidly as to be heat-electretized.

Measurements of piezo-electric constant of the piezo-electric materials obtained in the manner described above were taken. The results are shown in Table 6.

Table 6

| No. | Acetal resin (per cent by weight) | Chlorinated polypropylene (per cent by weight) | Piezo-electric constant (CGS esu) |
|---|---|---|---|
| 1 | 90 | 10 | $6.85 \times 10^{-7}$ |
| 2 | 70 | 30 | $7.13 \times 10^{-7}$ |
| 3 | 60 | 40 | $7.40 \times 10^{-7}$ |
| 4 | 50 | 50 | $6.90 \times 10^{-7}$ |
| 5 | 40 | 60 | $6.20 \times 10^{-7}$ |
| 6 | 30 | 70 | $5.33 \times 10^{-7}$ |

EXAMPLE 7

In the same manner as Example 1, acetal resin (trade name: DURACON, M 90, manufactured by POLY PLASTICS Company, Ltd.) and polymers shown in Table 7 were mixed with component ratio of 60/40 (acetal resin/polar resin) by weight. To the resulting blend polymer, lead zirconate-lead titanate $(Pb(Zr_{0.60}Ti_{0.40})O_3)$ ceramics powder was added with component ratio of 50/50 by volume. Each of the resulting composites was severally molded into a film. Then, to each film molded composite electric field of direct current of 200 KV/cm was applied for an hour, at a temperature of 40° C. Then each molded composite was so cooled rapidly while the whole condition maintained as to be heat-electretized.

Measurements of piezo-electric constant of the piezo-electric material obtained in the manner described above were taken. The results are shown in Table 7.

Table 7

| | Polar polymer | Relative permittivity | Modulus of elasticity (dyne/cm²) | Piezo-electric constant (CGS esu) |
|---|---|---|---|---|
| in the case of the present invention | Chlorinated polyethylene | | | $\times 10^{-8}$ |
| | Cl content 30[1] | 6.44 | $9.2 \times 10^7$ | 52.5 |
| | Cl content 40[2] | 6.80 | $4.1 \times 10^8$ | 52.8 |
| | Cl content 31.5[3] | 6.50 | $9.8 \times 10^7$ | 44.3 |
| | Cl content 31.8[4] | 6.50 | $8.0 \times 10^9$ | 19.8 |
| | Chloroprene rubber[5] | 7 – 8 | $\times 10^6$ | 48.2 |
| | Nitrile rubber acrylonitrile content 35%[6] | 15 | $40 \times 10^6$ | 75.8 |
| | Fluoroelastomer[7] | 6 | $\times 10^{45.6}$ | |
| | Polyester ether[8] | 4 – 6 | $6.5 \times 10^8$ | 41.4 |
| | Urethane rubber[9] | 6.4 – 7.1 | $\times 10^6$ | 41.8 |
| | Epichlorohydrin rubber[10] | 6 – 8 | $\times 10^6$ | 72.6 |
| | Chlorosulphonated polyethylen[11] | 8 – 10 | $\times 10^6$ | 45.1 |

[1]Trade name: Elaslene 301A, manufactured by Showa Denko Company, Ltd.
[2]Trade name: Elaslene 401A, manufactured by Showa Denko Company, Ltd.
[3]Trade name: Elaslene 345C, manufactured by Showa Denko Company, Ltd.
[4]Trade name: Elaslene TC-3, manufactured by Showa Denko Company, Ltd.
[5]Trade name: Neoprene W, manufactured by Showa Neoprene Company, Ltd.
[6]Trade name: JSR N230S, manufactured by JAPAN SYNTHETIC RUBBER Company, Ltd.
[7]Trade name: Viton A, manufactured by du Pont Company, Ltd. (vinylidene fluoride copolymer)
[8]Trade name: Hytrel 4055, manufactured by du Pont Company, Ltd.
[9]Trade name: Paraprene 22S, manufactured by Nihon Polyurethane Company, Ltd.
[10]Trade name: Gechron #1000 (Cl content 38%), manufactured by Nihon Zeon Company, Ltd.

Comparison

In the same manner as Example 1, acetal resin (trade name: Delrin 500, Manufactured by du Pont Company, Ltd.) and ethylene-vinyl acetate copolymer with vinyl acetate content of 28 percent by weight were mixed with various component ratios to form various blend polymers. To each of the resulting blend polymers, lead zirconate-lead titanate solid solution $(Pb(Zr_{0.55}Ti_{0.45})O_3 + 1$ wt. % $Nb_2O_5)$ ceramics powder was added with the component ratio of 50/50 by volume. Then each blend polymer and lead zirconate-lead titanate solid solution ceramics powder were mixed. The resulting composites were molded into films. To these film molded composite, electric field of direct current of 200 KV/cm was applied for an hour, at a temperature of 40° C. Then these film molded composite were so cooled rapidly while the whole condition maintained as to be heat-electretized.

Measurements of piezo-electric constant of the piezo-electric materials obtained in the manner described above were taken. The results are shown in Table 8.

Table 8

| No. | Acetal resin (per cent by weight) | Ethylene-vinyl acetate copolymer (per cent by weight) | Piezo-electric constant (CGS esu) |
|---|---|---|---|
| 1 | 100 | 0 | $6.80 \times 10^{-7}$ |
| 2 | 90 | 10 | $6.10 \times 10^{-7}$ |
| 3 | 70 | 30 | $5.50 \times 10^{-7}$ |

Table 8-continued

| No. | Acetal resin (per cent by weight) | Ethylene-vinyl acetate copolymer (per cent by weight) | Piezo-electric constant (CGS esu) |
|---|---|---|---|
| 4 | 60 | 40 | $5.16 \times 10^{-7}$ |
| 5 | 50 | 50 | $4.82 \times 10^{-7}$ |
| 6 | 40 | 60 | $4.35 \times 10^{-7}$ |

Table 9

| | Relative permittivity |
|---|---|
| Polar polymer | |
| Chloroprene rubber (CR) | 7 – 8 |
| Acrylonitrile-butadiene rubber | 7 – 20 |
| Epichlorohydrin rubber (CHR, CHC) | 6 – 8 |
| Polysulfide rubber | 4 – 6 |
| Fluoroelastomer | |
| Chlorotrifluoroethylene-vinylidene fluoride copolymer | 4 – 8 |
| Hexafluoropropylene-vinylidene fluoride copolymer | 5 – 15 |
| Chlorosulphonated polyethylene | 8 – 10 |
| Chlorinated polyethylene | 6 |
| Urethane rubber | 6 – 8 |
| Polyester ether rubber | 4 – 6 |
| Nonpolar polymer | |
| Polybutadiene | 2.7 |
| Butyl rubber | 2.3 |
| Ethylene-propylene rubber | 2.35 |
| Ethylene-propylene-diene terpolymer | 2.5 – 3.5 |
| Silicone rubber | 3 – 4 |
| Polyisoprene rubber | 2.5 |
| Isobutylene-isoprene rubber | 2.1 |
| Stylene-butadiene rubber | 2.4 – 2.6 |
| Stylene-butadiene-stylene copolymer | 2.9 |
| Stylene-isoprene-stylene copolymer | " |
| Ethylene-vinyl acetate copolymer | 2.6 |

What is claimed is:

1. Piezo-electric material which comprises a composite of blend polymer resin and piezo-electric ceramic powder, the blend polymer resin consisting of 99 to 20 percent by weight acetal resin and 1 to 80 percent by weight polar polymer said polymer having a relative permittivity above 4.0 and a modulus of elesticity under $8.0 \times 10^9$ dyne/cm$^2$, the blend polymer resin comprising 10 to 90 percent by volume of the composite, the composite being molded and electretized.

2. Piezo-electric material as claimed in claim 1, wherein the said polar polymer is acrylonitrile-butadiene rubber, epichlorohydrin rubber or a fluorinated chlorinated polyolefin in which the fluorine or chlorine is chemically bonded.

3. Piezo-electric material as claimed in claim 1, wherein the said polar polymer is an olefin polymer which has chlorine chemically bonded.

4. Piezo-electric material as claimed in claim 1, wherein the said polar polymer is acrylonitrile-butadiene rubber.

5. Piezo-electric material as claimed in claim 1, wherein the content of the acetal resin in the blended polymer is 90 to 30 percent by weight, and the content of the polar polymer in the blended polymer is 10 to 70 percent by weight, and the blend polymer resin comprises 10 to 90 percent by volume of the composite.

6. Piezo-electric material as claimed in claim 1, wherein the content of the acetal resin in the blended polymer is 90 to 30 percent by weight, and the content of the polar polymer is 10 to 70 percent by weight, and the blend polymer resin comprises 30 to 70 percent by volume of the composite.

7. Piezo-electric material as claimed in claim 1, wherein the molded composite is electretized by placing it between electrodes and in contact therewith and applying direct current voltage between the electrodes at a temperature of 30° to 100° C.

8. Piezo-electric material as claimed in claim 1, wherein the molded composite is electretized by placing it between electrodes and in contact therewith and applying an electric field of direct current of 100 to 600 KV/cm between the electrodes at a temperature of 30° to 100° C.

9. Piezo-electric material as claimed in claim 1, wherein the molded composite has the shape of a film.

* * * * *